(12) United States Patent
Chuang et al.

(10) Patent No.: US 7,009,416 B1
(45) Date of Patent: Mar. 7, 2006

(54) SYSTEMS AND METHODS FOR MONITORING INTEGRATED CIRCUIT INTERNAL STATES

(75) Inventors: Tatao Chuang, San Jose, CA (US); Devereaux C. Chen, Cupertino, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 494 days.

(21) Appl. No.: 09/984,325

(22) Filed: Oct. 29, 2001

(51) Int. Cl.
*G01R 31/02* (2006.01)
*G01R 31/26* (2006.01)

(52) U.S. Cl. ..................... 324/763; 324/765

(58) Field of Classification Search ............ 324/158.1, 324/765, 73.1, 763; 710/316; 714/25, 30–31, 714/718, 724

See application file for complete search history.

(56) References Cited

U.S. PATENT DOCUMENTS

| | | | | |
|---|---|---|---|---|
| 5,418,452 A | * | 5/1995 | Pyle | 324/158.1 |
| 5,479,652 A | * | 12/1995 | Dreyer et al. | 714/30 |
| 5,712,858 A | * | 1/1998 | Godiwala et al. | 714/724 |
| 5,717,695 A | * | 2/1998 | Manela et al. | 714/718 |
| 5,793,777 A | * | 8/1998 | Kundu | 714/724 |
| 6,003,107 A | * | 12/1999 | Ranson et al. | 710/316 |
| 6,191,603 B1 | * | 2/2001 | Muradali et al. | 324/765 |
| 6,781,406 B1 | * | 8/2004 | Emberling et al. | 326/38 |

* cited by examiner

*Primary Examiner*—Vinh Nguyen
*Assistant Examiner*—Russell M. Kobert
(74) *Attorney, Agent, or Firm*—Harrity&Snyder,LLP

(57) ABSTRACT

A system for monitoring internal states of an integrated circuit includes logic nodes, selection logic and a monitor unit. The logic nodes are disposed within the integrated circuit and the selection logic is coupled to monitor pins externally accessible on the integrated circuit. The selection logic retrieves internal states of select logic nodes based on signals applied via the monitor pins. The monitor unit reads the internal states of the select logic nodes via the monitor pins.

12 Claims, 3 Drawing Sheets

SYSTEMS AND METHODS FOR MONITORING INTEGRATED CIRCUIT INTERNAL STATES

BACKGROUND OF THE INVENTION

A. Field of the Invention

The present invention relates generally to monitoring systems and, more particularly, to systems and methods for monitoring and verifying integrated circuit internal states.

B. Description of Related Art

Conventional Integrated Circuit (IC) fabrication processes generally involve some level of error that can lead to defective or wholly inoperative fabricated ICs. Therefore, for the purpose of quality control, techniques have been developed for testing ICs post-fabrication. Such techniques have conventionally involved testing at the register transfer level (RTL). Testing at the RTL level has typically been implemented by specifying a path to the internal signals from the top-level of the design through the design hierarchy. This approach, however, is impractical for testing the IC at the gate-level since the design hierarchy and the signal names are usually non-obvious or non-present at the gate-level. Thus, register transfer level testing techniques are not easily applicable to gate-level testing.

Therefore, there exists a need for systems and methods that can test and verify IC internal states without requiring knowledge of the IC register transfer level hierarchy.

SUMMARY OF THE INVENTION

Consistent with the principles of the invention disclosed and claimed herein, internal state selection logic is provided that can send desired internal states to external monitor pins on an IC. Through appropriate programming of the internal state selection logic during actual testing of an IC, desired internal states can be probed without any knowledge of the IC register transfer level hierarchy.

In accordance with the principles of the invention as embodied and broadly described herein, a method of monitoring internal states of an integrated circuit includes providing selection logic within the integrated circuit, where the selection logic is coupled to monitor pins externally accessible on the integrated circuit; applying signals to the selection logic to select one or more nodes of the integrated circuit; and reading an internal state of the one or more nodes via the monitor pins.

Another implementation consistent with the principles of the invention includes a system for monitoring internal states of an integrated circuit that further includes logic nodes disposed within the integrated circuit; selection logic coupled to monitor pins externally accessible on the integrated circuit, the selection logic configured to retrieve internal states of select logic nodes based on signals applied via the monitor pins; and a monitor unit configured to read the internal states of the select logic nodes via the monitor pins.

Yet another implementation consistent with the principles of the invention includes a circuit for monitoring internal states of an integrated circuit, the circuit including selection logic that further includes a group of multiplexers. The multiplexers are configured to multiplex internal states of logic nodes of the integrated circuit to one or more output lines. The output lines are electrically coupled to monitor pins that are further coupled to an external surface of the integrated circuit.

BRIEF DESCRIPTION OF THE DRAWINGS

The accompanying drawings, which are incorporated in and constitute a part of this specification, illustrate an embodiment of the invention and, together with the description, explain the invention. In the drawings.

DETAILED DESCRIPTION

The following detailed description of the invention refers to the accompanying drawings. The same reference numbers in different drawings may identify the same or similar elements. Also, the following detailed description does not limit the invention. Instead, the scope of the invention is defined by the appended claims and equivalents of the claim limitations.

Systems and methods consistent with the principles of the invention permit the monitoring of internal states of logic nodes of an IC. Through the provision of internal state selection logic within the IC, systems and methods consistent with the principles of the invention enable observation of desired internal states at the monitor pins for monitoring by a monitor unit, such as a logic analyzer.

Exemplary IC Internal State Monitoring System

Figure 1:
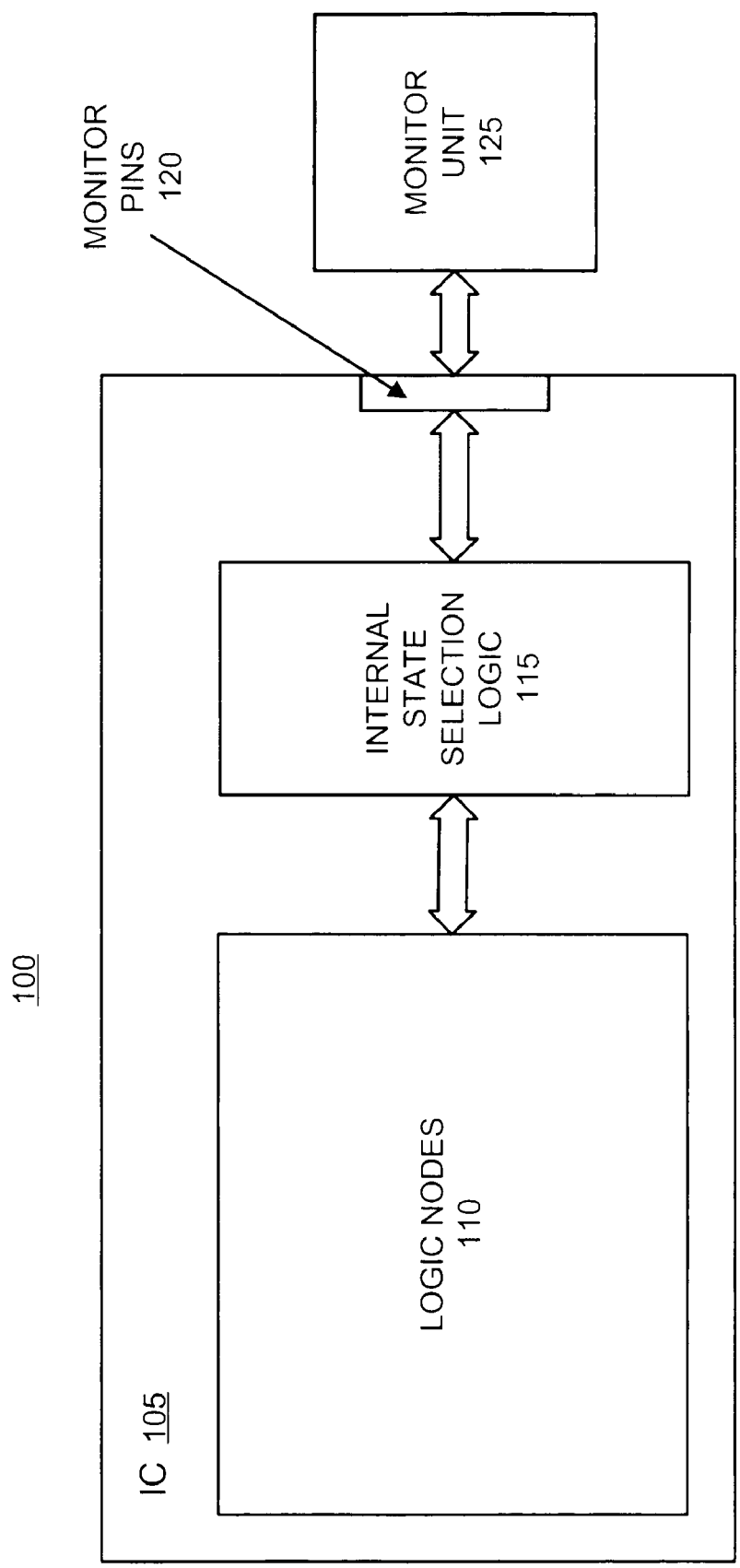
FIG. 1 is an exemplary diagram of an IC internal state monitoring system consistent with the principles of the invention.

FIG. 1 is a diagram of an exemplary system 100 for monitoring an integrated circuit's internal states. System 100 may include an integrated circuit (IC) 105 and a monitor unit 125. IC 105 may include a group of logic nodes 110, internal state selection logic 115 and monitor pins 120. Each node of logic nodes 110 may include any type of logic gate or logic element (e.g., AND, NAND, OR, NOR, XOR gates) and their respective inputs and outputs. Internal state selection logic 115 may include logic circuitry, such as, for example, one or more multiplexers that can multiplex the signals input to, or output from, each logic node of logic nodes 110.

Monitor pins 120 may include electrical contacts for monitoring the signals of logic nodes 110 that have been selected by internal state selection logic 115. Monitor pins 120 may further include electrical contacts for accepting control signals from monitor unit 125, enabling monitor unit 125 to program internal state selection logic 115 to select specific nodes and/or groups of nodes for monitoring. Monitor pins 120 may be special purpose pins dedicated to monitoring, or dual-purpose, usable for monitoring and/or normal operation of IC 105. Monitor unit 125 may include any device for monitoring signals from an IC. Monitor unit 125 may included for example, a logic analyzer or a computer.

Exemplary Internal State Selection Logic

Figure 2:
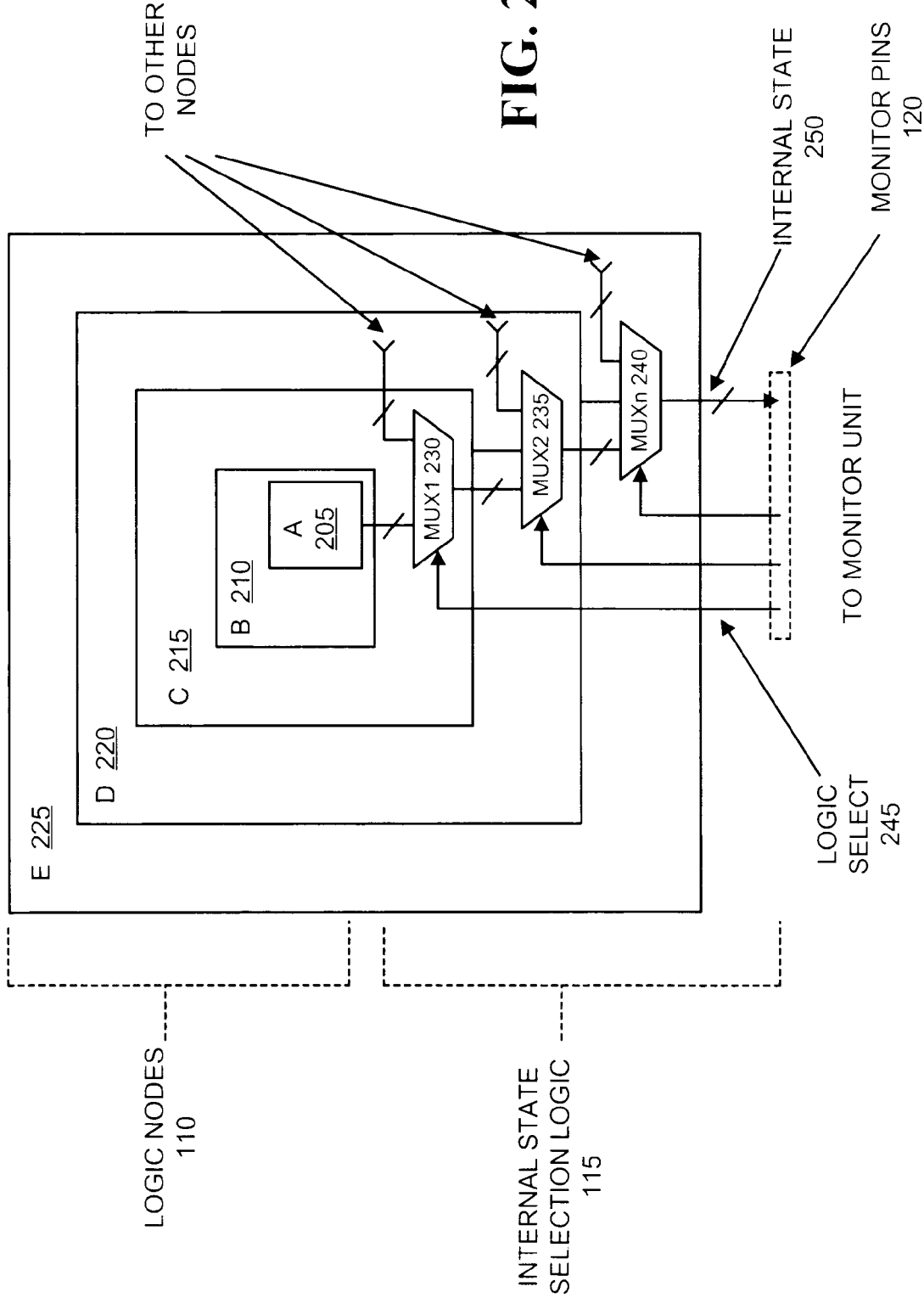
FIG. 2 is an exemplary diagram of IC nodes and internal state selection logic according to an implementation consistent with the principles of the invention.

FIG. 2 is an exemplary diagram of the components of internal state selection logic 115 according to an implementation consistent with the principles of the invention. Internal state selection logic 115 may be used to select one or more logic nodes 110 whose input/output signals are to be sent to monitor pins 120. As one example, logic nodes 110 are illustrated as including logic nodes A 205, B 210, C 215, D 220, and E 225. Internal state selection logic 115 may include multiple multiplexers (e.g., MUX 1 230, MUX2 235, MUXn 240) for multiplexing the signals from selected nodes of logic nodes 110. Each multiplexer may have multiple inputs from one or more nodes. Multiplexers MUX 1 230–MUXn 240 may multiplex signals from nodes of logic nodes 110 according to inputs applied to logic select lines 245 of monitor pins 120. Inputs applied to logic select lines 245 may control the selection of signals from the nodes of logic nodes 110 that may be multiplexed to an internal state output 250 of monitor pins 120.

Exemplary Internal State Verification Process

Figure 3:
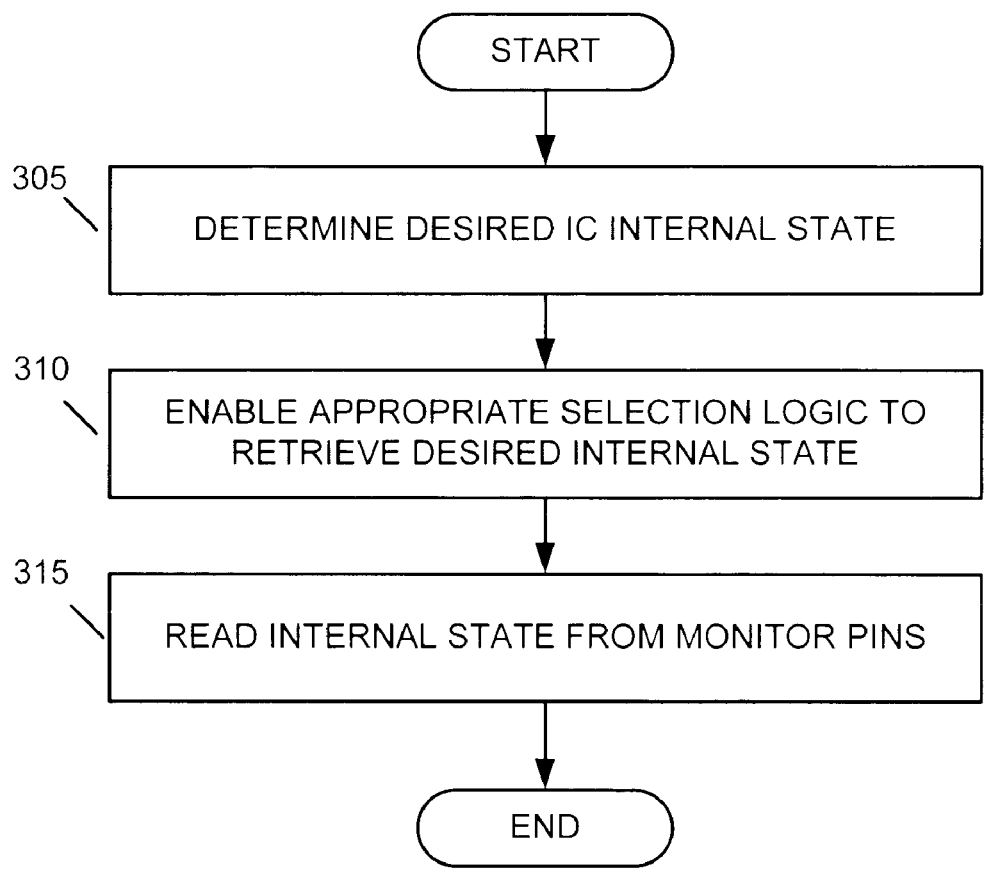
FIG. 3 is an exemplary flowchart of an IC internal state monitoring process consistent with the principles of the invention.

FIG. 3 is an exemplary flowchart of an internal state verification process that may be implemented by a system, such as system 100, consistent with the principles of the invention. The process may begin with a determination of a desired IC internal state to monitor with system 100 (act 305). When the desired IC internal state is determined, appropriate selection logic may be enabled, via logic select lines 245, to retrieve the internal state via the internal state lines 250 of monitor pins 120 (act 310). The appropriate selection logic may be enabled via monitor unit 125. The internal state of the IC may then be read from the internal state lines 250 using monitor unit 125 (act 315). Acts 305–315 of FIG. 3 can be selectively repeated to retrieve all desired internal states of IC 105.

CONCLUSION

Consistent with the principles of the present invention, internal states of an IC can be probed via externally located monitor pins. Through the provision of internal state selection logic within the IC, implementations consistent with the principles of the invention may permit the multiplexing of desired internal states (e.g., gate-level states) to the monitor pins for monitoring by a monitor unit, such as a logic analyzer.

The foregoing description of embodiments of the present invention provides illustration and description, but is not intended to be exhaustive or to limit the invention to the precise form disclosed. Modifications and variations are possible in light of the above teachings or may be acquired from practice of the invention. For example, although the embodiments illustrate gate-level signals, signals at nodes of other levels of the logic hierarchy could also be monitoring in embodiments consistent with the present invention. While a series of acts have been described with regard to FIG. 3, the order of the acts may differ or be performed in parallel in other implementations consistent with the present invention. No elements act, or instruction used in the description of the principles of the invention should be construed as critical unless explicitly described as such. Also as used herein, the article "a" is intended to include one or more items. Where only one item is intended, the term "one" or similar language is used.

The scope of the invention is defined by the claims and their equivalents.

What is claimed is:

1. A method of monitoring internal states of an integrated circuit, comprising:
   providing selection logic within the integrated circuit, wherein the selection logic is connected to pins externally accessible on the integrated circuit, wherein the selection logic comprises a plurality of multiplexers and wherein the plurality of multiplexers comprises n cascaded multiplexers, wherein n−1 of the n cascaded multiplexers have as an input an output of a previous multiplexer in the cascade and wherein n is greater than or equal to three;
   applying signals to the selection logic, via a first portion of the pins, that identify one or more nodes of the integrated circuit to be selected; and
   reading an internal state of the one or more selected nodes via a second portion of the pins.

2. The method of claim 1, wherein the one or more nodes comprise one or more logic elements.

3. The method of claim 1, further comprising:
   multiplexing the internal state of the one or more nodes to the monitor pins based on the applied signals.

4. A system for monitoring internal states of an integrated circuit, comprising:
   logic nodes disposed within the integrated circuit;
   selection logic coupled to monitor pins externally accessible on the integrated circuit, the selection logic configured to retrieve internal states of select logic nodes based on signals applied via the monitor pins that identify the select logic nodes, wherein the selection logic comprises n cascaded multiplexers, wherein n−1 of the n cascaded multiplexers have as an input an output of a previous multiplexer in the cascade, wherein n is greater than or equal to three; and
   a monitor unit configured to apply the signals to the monitor pins and to read the internal states of the select logic nodes via the monitor pins.

5. The system of claim 4, wherein the select logic nodes comprise one or more logic elements.

6. The system of claim 4, wherein the n cascaded multiplexers are each configured to multiplex the internal states of the select logic nodes to the monitor pins based on the applied signals.

7. The system of claim 4, wherein each of the n cascaded multiplexers is coupled to one or more of the logic nodes.

8. A circuit for monitoring internal states of logic nodes of an integrated circuit, comprising:
   selection logic comprising n cascaded multiplexers, the n cascaded multiplexers configured to multiplex internal states of the logic nodes to one or more output lines, wherein n−1 of the n cascaded multiplexers have as an input an output of a previous multiplexer in the cascade and wherein n is greater than or equal to three; and
   monitor pins coupled to an external surface of the integrated circuit, the monitor pins electrically coupled to the one or more output lines.

9. A method of monitoring internal states of an integrated circuit, comprising:
   receiving logic select signals that identify one or more logic nodes of the integrated circuit from a monitoring unit via a first portion of pins on an external surface of the integrated circuit;
   multiplexing, via n cascaded multiplexers, internal states from the one or more logic nodes to one or more output lines based on the received logic select signals, wherein n−1 of the n cascaded multiplexers have as an input an output of a previous multiplexer in the cascade and wherein n is greater than or equal to three; and
   coupling the multiplexed internal states to a second portion of the pins for monitoring by the monitoring unit.

10. The method of claim 9, wherein the logic nodes comprise one or more logic elements.

11. A system for monitoring logic elements within an integrated circuit, comprising:
- a plurality of logic elements within the integrated circuit;
- a plurality of cascaded multiplexers coupled to the plurality of logic elements;
- selection logic coupled to monitor pins externally accessible on the integrated circuit, the selection logic comprising the plurality of cascaded multiplexers coupled to the plurality of logic elements, the plurality of cascaded multiplexers configured to:
  - identify a specific logic element from the plurality of logic elements based on signals applied via the monitor pins, and
  - multiplex an input signal to, or output signal from, the specific logic element to the monitor pins.

12. A method of monitoring internal states of an integrated circuit, comprising:
- providing selection logic within the integrated circuit, wherein the selection logic is connected to pins externally accessible on the integrated circuit and wherein the selection logic comprises a plurality of multiplexers;
- applying signals to the selection logic, via a first portion of the pins, that identify one or more nodes of the integrated circuit to be selected; and
- reading an internal state of the one or more selected nodes via a second portion of the pins.

\* \* \* \* \*